United States Patent
Kindred et al.

(10) Patent No.: US 9,559,653 B2
(45) Date of Patent: Jan. 31, 2017

(54) DIGITAL AUTOMATIC GAIN CONTROL

(71) Applicant: K/S HIMPP, Lynge (DK)

(72) Inventors: Jon S. Kindred, Minneapolis, MN (US); Bryant Sorensen, Colorado Springs, CO (US); Jerry Wahl, Woodland Park, CO (US)

(73) Assignee: K/S HIMPP, Lynge (DK)

( * ) Notice: Subject to any disclaimer, the term of this patent is extended or adjusted under 35 U.S.C. 154(b) by 926 days.

(21) Appl. No.: 13/849,652

(22) Filed: Mar. 25, 2013

(65) Prior Publication Data

US 2013/0285747 A1 Oct. 31, 2013

Related U.S. Application Data

(60) Continuation of application No. 12/356,256, filed on Jan. 20, 2009, now abandoned, which is a division of application No. 09/730,200, filed on Dec. 5, 2000, now Pat. No. 7,489,790.

(51) Int. Cl.
| | |
|---|---|
| *H03G 3/00* | (2006.01) |
| *H03G 3/30* | (2006.01) |
| *H03G 1/04* | (2006.01) |
| *H03G 7/08* | (2006.01) |
| *H04R 25/00* | (2006.01) |

(52) U.S. Cl.
CPC .............. *H03G 3/3005* (2013.01); *H03G 1/04* (2013.01); *H03G 3/301* (2013.01); *H03G 7/08* (2013.01); *H04R 25/356* (2013.01); *H04R 25/505* (2013.01)

(58) Field of Classification Search
CPC .......... H03G 3/00; H03G 3/001; H03G 3/002; H03G 5/04; H03G 5/165; H03G 7/002; H03G 7/007; H03G 7/06; H03G 9/005; H03G 9/02; H03G 9/025; H03G 1/0088; H03G 3/3005; H03G 3/301
USPC ....... 381/102, 104–109, 312, 320, 321, 120; 330/278, 254, 280
See application file for complete search history.

(56) References Cited

U.S. PATENT DOCUMENTS

| | | |
|---|---|---|
| 3,484,556 A | 12/1969 | Flanagan et al. |
| 3,527,901 A | 9/1970 | Geib |
| 4,052,568 A | 10/1977 | Jankowski |

(Continued)

FOREIGN PATENT DOCUMENTS

WO     WO-00/21332 A2     4/2000

OTHER PUBLICATIONS

U.S. Appl. No. 12/356,256, Non Final Office Action mailed Sep. 25, 2012, 12 pgs.

(Continued)

*Primary Examiner* — Xu Mei
(74) *Attorney, Agent, or Firm* — Sterne, Kessler, Goldstein & Fox PLLC

(57) ABSTRACT

Systems, devices, and methods are provided to inhibit apparent amplitude modulation in non-linear processing that causes distortion in a processed signal. One aspect of the invention includes a hearing aid. The hearing aid includes a microphone to receive an input signal, a speaker to reproduce the input signal, and a processor. The processor processes the input signal using a gain. The processor includes an inhibitor, which inhibits distortions, and an adjuster, which adjusts the gain. The inhibitor acts to smooth an envelope of the input signal to inhibit undesired modulation. The adjuster adjusts the gain if the envelope is either above or below a threshold.

18 Claims, 8 Drawing Sheets

(56) References Cited

U.S. PATENT DOCUMENTS

| | | | |
|---|---|---|---|
| 4,071,695 A * | 1/1978 | Flanagan | H03G 3/34 |
| | | | 381/106 |
| 4,366,349 A | 12/1982 | Adelman | |
| 4,396,806 A | 8/1983 | Anderson | |
| 4,410,764 A | 10/1983 | Werth et al. | |
| 4,419,544 A | 12/1983 | Adelman | |
| 4,471,490 A | 9/1984 | Bellafiore | |
| 4,495,643 A * | 1/1985 | Orban | H03G 7/002 |
| | | | 327/309 |
| 4,637,402 A | 1/1987 | Adelman | |
| 4,741,018 A | 4/1988 | Potratz et al. | |
| 4,882,762 A | 11/1989 | Waldhauer | |
| 4,920,568 A | 4/1990 | Kamiya et al. | |
| 5,091,952 A | 2/1992 | Williamson et al. | |
| 5,276,764 A | 1/1994 | Dent | |
| 5,323,337 A | 6/1994 | Wilson et al. | |
| 5,390,254 A | 2/1995 | Adelman | |
| 5,434,924 A | 7/1995 | Jampolsky | |
| 5,488,668 A | 1/1996 | Waldhauer | |
| 5,502,769 A | 3/1996 | Gilbertson | |
| 5,524,057 A | 6/1996 | Akiho et al. | |
| 5,528,695 A * | 6/1996 | Klippel | H04R 3/002 |
| | | | 330/278 |
| 5,528,696 A | 6/1996 | Ribic | |
| 5,553,151 A | 9/1996 | Goldberg | |
| 5,553,152 A | 9/1996 | Newton | |
| 5,581,747 A | 12/1996 | Anderson | |
| 5,631,969 A | 5/1997 | Hanson | |
| 5,633,937 A | 5/1997 | Ribic | |
| 5,659,621 A | 8/1997 | Newton | |
| 5,687,241 A | 11/1997 | Ludvigsen | |
| 5,706,357 A | 1/1998 | Yang | |
| 5,757,933 A | 5/1998 | Preves et al. | |
| 5,822,442 A | 10/1998 | Agnew et al. | |
| 5,825,631 A | 10/1998 | Prchal | |
| 5,835,611 A | 11/1998 | Kaiser et al. | |
| 5,852,668 A | 12/1998 | Ishige et al. | |
| 5,862,238 A | 1/1999 | Agnew et al. | |
| 5,884,255 A | 3/1999 | Cox | |
| 5,892,834 A | 4/1999 | Smart et al. | |
| 5,903,655 A | 5/1999 | Salmi et al. | |
| 5,912,977 A | 6/1999 | Gottschalk-Schoenig | |
| 6,005,953 A | 12/1999 | Stuhlfelner | |
| 6,041,129 A | 3/2000 | Adelman | |
| 6,049,617 A | 4/2000 | Sigwanz et al. | |
| 6,049,618 A | 4/2000 | Saltykov | |
| 6,097,823 A | 8/2000 | Kuo | |
| 6,104,822 A | 8/2000 | Melanson et al. | |
| 6,108,431 A | 8/2000 | Bachler | |
| 6,130,950 A | 10/2000 | Martin | |
| 6,151,400 A | 11/2000 | Seligman | |
| 6,173,062 B1 | 1/2001 | Dibachi et al. | |
| 6,198,830 B1 | 3/2001 | Holube et al. | |
| 6,205,225 B1 | 3/2001 | Orban | |
| 6,236,731 B1 | 5/2001 | Brennan et al. | |
| 6,240,192 B1 | 5/2001 | Brennan et al. | |
| 6,255,898 B1 | 7/2001 | Ono et al. | |
| 6,256,395 B1 | 7/2001 | Melanson | |
| 6,292,571 B1 | 9/2001 | Sjursen | |
| 6,347,148 B1 | 2/2002 | Brennan et al. | |
| 6,366,863 B1 | 4/2002 | Bye et al. | |
| 6,389,142 B1 | 5/2002 | Hagen et al. | |
| 6,449,662 B1 | 9/2002 | Armitage | |
| 6,490,556 B1 | 12/2002 | Graumann et al. | |
| 6,522,746 B1 | 2/2003 | Marchok et al. | |
| 6,526,139 B1 | 2/2003 | Rousell et al. | |
| 6,526,140 B1 | 2/2003 | Marchok et al. | |
| 6,529,607 B1 | 3/2003 | Sigwanz et al. | |
| 6,628,795 B1 * | 9/2003 | Ludvigsen | H04R 25/356 |
| | | | 381/107 |
| 7,139,403 B2 * | 11/2006 | Richardson | H03G 1/04 |
| | | | 381/104 |
| 7,489,790 B2 * | 2/2009 | Kindred | H03G 1/04 |
| | | | 381/102 |
| 8,009,842 B2 * | 8/2011 | Richardson | H03G 1/04 |
| | | | 381/102 |
| 2001/0007050 A1 | 7/2001 | Adelman | |
| 2002/0076073 A1 | 6/2002 | Taenzer et al. | |
| 2002/0110253 A1 | 8/2002 | Richardson et al. | |
| 2007/0147639 A1 | 6/2007 | Richardson et al. | |
| 2009/0208033 A1 | 8/2009 | Kindred et al. | |

OTHER PUBLICATIONS

European Application Serial No. 01992008.1, Examination Notification Art. 94(3) mailed Jun. 27, 2013, 5 pgs.
U.S. Appl. No. 09/730,200, Final Office Action mailed Apr. 17, 2008, FOAR, 7 pgs.
U.S. Appl. No. 09/730,200, Non Final Office Action mailed Dec. 29, 2004, 12 pgs.
U.S. Appl. No. 09/730,200, Non Final Office Action mailed Feb. 11, 2004, 23 pgs.
U.S. Appl. No. 09/730,200, Non Final Office Action mailed Apr. 19, 2007, 7 pgs.
U.S. Appl. No. 09/730,200, Non Final Office Action mailed Jul. 28, 2006, 6 pgs.
U.S. Appl. No. 09/730,200, Non Final Office Action mailed Sep. 24, 2007, 6 pgs.
U.S. Appl. No. 09/730,200, Notice of Allowance mailed Oct. 2, 2008, NOAR, 04 pgs.
U.S. Appl. No. 09/730,200, Response filed Jan. 23, 2006 to Restriction Requirement mailed Nov. 22, 2005, 7 pgs.
U.S. Appl. No. 09/730,200, Response filed Jan. 24, 2008 to Non Final Office Action mailed Sep. 24, 2007, 11 pgs.
U.S. Appl. No. 09/730,200, Response filed Oct. 27, 2003 to Restriction Requirement mailed Aug. 27, 2003, 11 pgs.
U.S. Appl. No. 09/730,200, Response filed Dec. 27, 2006 to Non Final Office Action mailed Jul. 28, 2006, 9 pgs.
U.S. Appl. No. 09/730,200, Response filed May 16, 2006 to Restriction Requirement mailed Apr. 19, 2006, 8 pgs.
U.S. Appl. No. 09/730,200, Response filed May 31, 2005 to Non Final Office Action mailed Dec. 29, 2004, 21 pgs.
U.S. Appl. No. 09/730,200, Response filed Jul. 9, 2007 to Non Final Office Action mailed Apr. 9, 2007, 10 pgs.
U.S. Appl. No. 09/730,200, Response filed Aug. 11, 2004 to Non Final Office Action mailed Aug. 11, 2004, 11 pgs.
"Application U.S. Appl. No. 09/730,200, Response filed 8-18-08 to Final Office Action mailed Apr. 1708", 12 pages.
U.S. Appl. No. 09/730,200, Restriction Requirement mailed Nov. 22, 2005, 4 pgs.
U.S. Appl. No. 09/730,200, Restriction Requirement mailed Apr. 19, 2006, 6 pgs.
U.S. Appl. No. 09/730,200, Restriction Requirement mailed Aug. 27, 2003, 5 pgs.
U.S. Appl. No. 11/456,777 Non-Final Office Action mailed Jul. 9, 2010, 5 pgs.
U.S. Appl. No. 11/456,777, Final Office Action mailed Dec. 22, 2010, 5 pgs.
U.S. Appl. No. 11/456,777, Notice of Allowance mailed Apr. 20, 2011, 5 pgs.
U.S. Appl. No. 11/456,777, Preliminary Amendment filed Feb. 23, 2007, 6 pgs.
U.S. Appl. No. 11/456,777, Response filed Mar. 21, 2011 to Final Office Action mailed Dec. 22, 2010, 7 pgs.
U.S. Appl. No. 11/456,777, Response filed Oct. 8, 2010 to Non Final Office Action mailed Jul. 9, 2010, 7 pgs.
U.S. Appl. No. 12/356,256, Non Final Office Action mailed Sep. 25, 2012, 13 pgs.
European Application Serial No. 01992008.1, Office Action mailed Sep. 21, 2007, 3 pgs.
European Application Serial No. 01992008.1, Response filed Apr. 23, 2008 to Office Action mailed Sep. 21, 2007, 39 pgs.
International Application Serial No. PCT/US01/46476, International Search Report mailed Jun. 30, 2003, 3 pgs.
"Power Estimator for Automatic Gain Control", IBM Technical Disclosure Bulletin, (Dec. 1993), 1-4.

(56) References Cited

OTHER PUBLICATIONS

Griffing, Terry S, et al., "Acoustical Efficiency of Canal ITE Aids", Audecibel, (Spring 1983), 30-31.
Griffing, Terry S, et al., "Custom canal and mini in-the-ear hearing aids", Hearing Instruments, vol. 34, No. 2, (Feb. 1983), 31-32.
Griffing, Terry S, et al., "How to evaluate, sell, fit and modify canal aids", Hearing Instruments, vol. 35, No. 2, (Feb. 1984), 3 pgs.
Mahon, William J, "Hearing Aids Get a Presidential Endorsement", The Hearing Journal (Oct. 1983), 7-8.
Sullivan, Roy F, "Custom canal and concha hearing instruments: A real ear comparison Part I", Hearing Instruments, vol. 40, No. 4, (Jul. 1989), 23-29.
Sullivan, Roy F, "Custom canal and concha hearing instruments: A real ear comparison Part II", Hearing Instruments, vol. 40, No. 7, (Jul. 1989), 30-36.

\* cited by examiner

DIGITAL AUTOMATIC GAIN CONTROL

RELATED APPLICATION

This application is a continuation of U.S. application Ser. No. 12/356,256 filed Jan. 20, 2009, which is a divisional of U.S. application Ser. No. 09/730,200 filed Dec. 5, 2000, which applications are incorporated herein by reference and made a part hereof in their entirety.

TECHNICAL FIELD

The present invention relates generally to audio signal processing. More particularly, it pertains to inhibiting distortions that arise from adjusting gains of preamplifiers.

BACKGROUND

Sound systems can be broken down into three general components: an input device, such as a microphone; a processing system; and an output device, such as a speaker. Sounds are picked up by the microphone, transmitted to the processing system where they are processed, and then projected by the speaker so that the sounds can be heard at an appropriate distance. Both the microphone and the speaker are generally considered to be transducers.

A transducer is a device that transforms one form of energy into another form of energy. In the case of a microphone, sound energy, which can be detected by the human ear in the range of 20 Hertz to 20,000 Hertz, is transformed into electrical energy in the form of an electrical signal. The electrical signal can then be processed by a processing system. After the signal is processed, the speaker transforms the electrical energy in the electrical signal to sound energy again.

Before reaching the processing system, the electrical signal is amplified by a preamplifier using a certain gain. However, if the electrical signal already represents a powerful sound energy, the amplified electrical signal may be at a level beyond the linear operating range of the signal processing circuitry following the preamplifier. To limit the electrical signal to the operating range of the signal processing circuitry, an automatic gain control is used.

The automatic gain control detects the level of the waveform of the electrical signal, compares the level to a threshold, and adjusts the gain of the preamplifier to decrease the level of the electrical signal if the envelope is higher than the threshold. When the level is below the threshold, the automatic gain control increases the gain to its uncompressed level.

However, the automatic gain control, which is supposed to help, also hinders by adding undesired distortions to the electrical signal. These undesired distortions are frustrating to users of sound systems in general, but are particularly debilitating for users of hearing aids since these users depend upon such aids to maintain their ability to communicate. Without an acceptable solution to the undesired distortions, the optimum level of performance desired by the end user will not be achieved.

Thus, what are needed are systems, devices, and methods to inhibit AGC-induced distortions in sound systems, such as hearing aids.

SUMMARY

The above-mentioned problems with distortions in audio signal processing as well as other problems are addressed by the present invention and will be understood by reading and studying the following specification. Systems, devices, and methods are described which inhibit AGC-induced distortions.

One illustrative embodiment includes a method for providing automatic gain control. The method includes smoothing an envelope of an input signal having a gain and adjusting the gain that is applied to the input signal. The act of adjusting is dependent on the level of the envelope relative to a threshold. The act of smoothing inhibits distortions arising from apparent modulation of the input signal.

Another illustrative embodiment includes a hearing aid. The hearing aid includes an adjuster to adjust the gain so as to amplify an input signal, and a detector to form a smooth envelope that is a rectified version from the input signal. The detector presents the smooth envelope to the adjuster. The adjuster adjusts the gain that is applied to the input signal. The adjuster adjusts the gain based on the level of the envelope relative to a threshold.

The digital system as will be described has a number of benefits not seen before. One benefit is an enhanced manufacturing process that reduces a need for external components, such as capacitors, and the need to couple the external components to a circuit through I/O pins. Another benefit includes a reduction in the die area required to implement the digital automatic gain control loop. Other benefits include an enhanced control of the tolerance of the bandwidth of the automatic gain control, and the tolerance of the loop time constants of the automatic gain control. The system also benefits from an enhanced power efficiency and low operating voltage performance. Additionally, the system allows a non-linear signal processing by selectively controlling the gain of the preamplifier or providing information to a Nyquist-rate digital signal processor to compensate for adaptive gain changes in the preamplifier.

These and other embodiments, aspects, advantages, and features of the present invention will be set forth in part in the description which follows, and in part will become apparent to those skilled in the art by reference to the following description of the invention and drawings or by practice of the invention. The aspects, advantages, and features of the invention are realized and attained by means of the instrumentalities, procedures, and combinations particularly pointed out in the appended claims.

DETAILED DESCRIPTION

Figure 1:
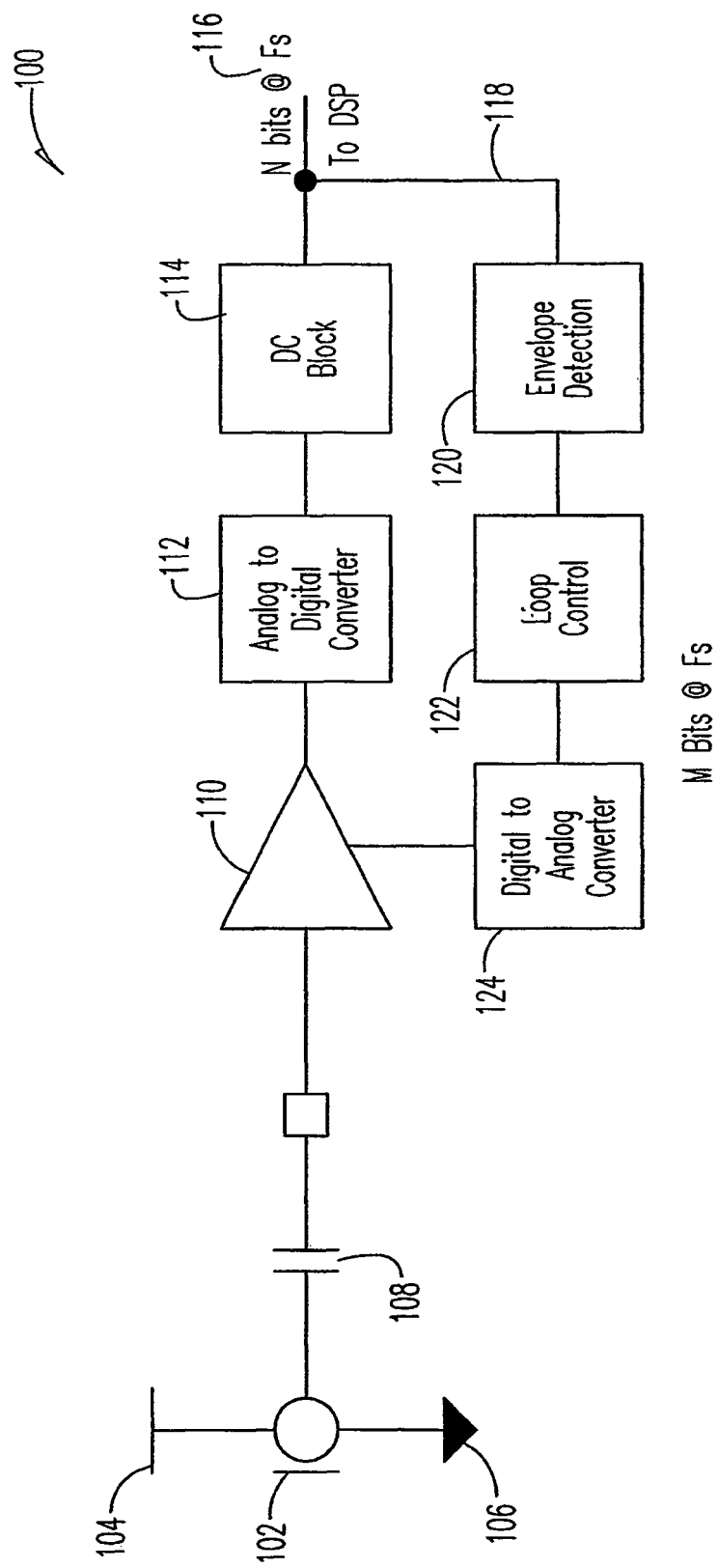
FIG. 1 is a block diagram of a system according to one embodiment of the invention.

In the following detailed description of the invention, reference is made to the accompanying drawings that form a part hereof, and in which are shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention.

The embodiments of the invention focus on inhibiting distortions that arise from automatic adjustments of the gain of preamplifiers in sound systems. An ear-worn hearing aid is an example of such a sound system. As discussed hereinbefore, the automatic gain control, which helps in adjusting the gain of the preamplifier, also hinders by adding undesired distortions to the electrical signal.

The automatic gain control detects the envelope of the waveform of the electrical signal, compares the envelope to a threshold, and adjusts the gain of the preamplifier. The act of detecting the envelope includes sampling the waveform of the electrical signal to form samples of the envelope that are representative of the magnitude of the waveform. Each sample of the envelope is then compared to the threshold by the act of comparing. If any of the samples is greater than or less than the threshold, the gain of the preamplifier is adjusted by the act of adjusting. After the gain is adjusted, the preamplifier amplifies the electrical signal so as to form an amplified electrical signal.

A curious phenomenon may occur during the acts of detecting, comparing, and adjusting: The magnitude of the waveform of the amplified electrical signal, for certain frequencies, appears as if it has been modulated so as to form an amplitude modulation. This amplitude modulation is unwanted because it will give rise to the undesired distortions. This phenomenon occurs when the frequency of the electrical signal is slightly removed from a rational factor of the sampling frequency.

Each sample of the envelope that includes the apparent modulation is then compared to the threshold by the act of comparing. If any of the samples is greater than or less than the threshold, the gain of the preamplifier is adjusted by the act of adjusting. However, because of the apparent modulation in the envelope, the gain no longer tracks the true envelope of the signal but varies periodically. This gain, which varies periodically, is applied to the electrical signal by the preamplifier. The preamplifier produces an amplitude modulation as a result of the application of the gain, which varies, to the electrical signal.

This amplitude modulation adds undesired frequency components to the electrical signal. These undesired frequency components are distortions which are inhibited by the embodiments of the invention. The embodiments of the invention solve this and other problems as discussed hereinbelow.

FIG. 1 is a block diagram of a system in accordance with one embodiment. A system 100 includes a microphone 102. The microphone 102 transduces sound energy into an electrical signal. The microphone 102 is powered by a voltage supply 104. The microphone 102 also couples to ground 106.

The electrical signal is presented to a capacitor 108. The capacitor 108 removes the direct-current (DC) component of the electrical signal and presents the electrical signal to a preamplifier 110 without the direct-current component. The preamplifier 110 amplifies the electrical signal using a gain. As discussed hereinbefore, the electrical signal may be at a level that is too weak for subsequent circuitry to process. The preamplifier 110 adjusts the level of the electrical signal so that the electrical signal is within a range that is appropriate for further processing.

The electrical signal, which has been amplified, is presented to an analog-to-digital converter 112. The analog-to-digital converter 112 converts the electrical signal from an analog form to a digital form. The digital form includes a desired number of bits (N) at a predetermined sampling rate ($F_s$). The electrical signal, which is in the digital form, is presented to a filter 114. The filter 114 blocks the DC component of the electrical signal. The filter 114 removes low frequencies from the electrical signal. In one embodiment, the low frequencies include frequencies less than about 100 Hertz. The electrical signal with the low frequencies removed is presented as a signal 116. The signal 116 is presented to the rest of the system 100 for processing.

The signal 116 also forms a feedback signal 118. The feedback signal 118 is presented to a detector 120. In one embodiment, the detector 120 inhibits apparent modulation in the feedback signal 118 so as to inhibit distortions in the signal 116. In another embodiment, the detector 120 forms a smooth envelope of the feedback signal 118. The smooth envelope is a filtered estimate of the feedback signal 118. The smooth envelope lacks the apparent modulation. Because of the absence of the apparent modulation in the smooth envelope, distortion of the signal 116 is inhibited.

The detector 120 presents the smooth envelope to an adjuster 122. The adjuster 122 adjusts the gain of the preamplifier 110 if the smooth envelope is above or below a threshold. The adjuster 122 adjusts the gain of the preamplifier 110 by producing an adjustment signal. In one embodiment, the adjustment signal is in a digital form. The digital form includes a desirable number of bits (M) at a predetermined sampling rate ($F_s$).

The adjuster presents the adjustment signal to a digital-to-analog converter 124. The digital-to-analog converter converts the adjustment signal from the digital form to an analog form. In analog form, the adjustment signal is an analog adjustment that is used by the preamplifier 110. The adjustment signal lacks the apparent modulation. The preamplifier 110 amplifies the electrical signal using the adjustment signal so as to form an amplified electrical signal. The amplified electrical signal excludes the amplitude modulation that would have formed if the adjustment signal were to include the apparent modulation. Thus, the amplified electrical signal contains desired frequency contents and lacks the amplitude modulation that gives rise to distortions.

In one embodiment, the detector 120 includes a Hilbert filter. The Hilbert filter receives the feedback signal 118 and produces two signals that are 90 degrees out of phase with each other. The detector 120 squares each signal of the two signals. The detector 120 then sums the two squared signals to form the smooth envelope. In another embodiment, the detector 120 takes the square root of the sum of the two squared signals to form the smooth envelope.

Figure 2:
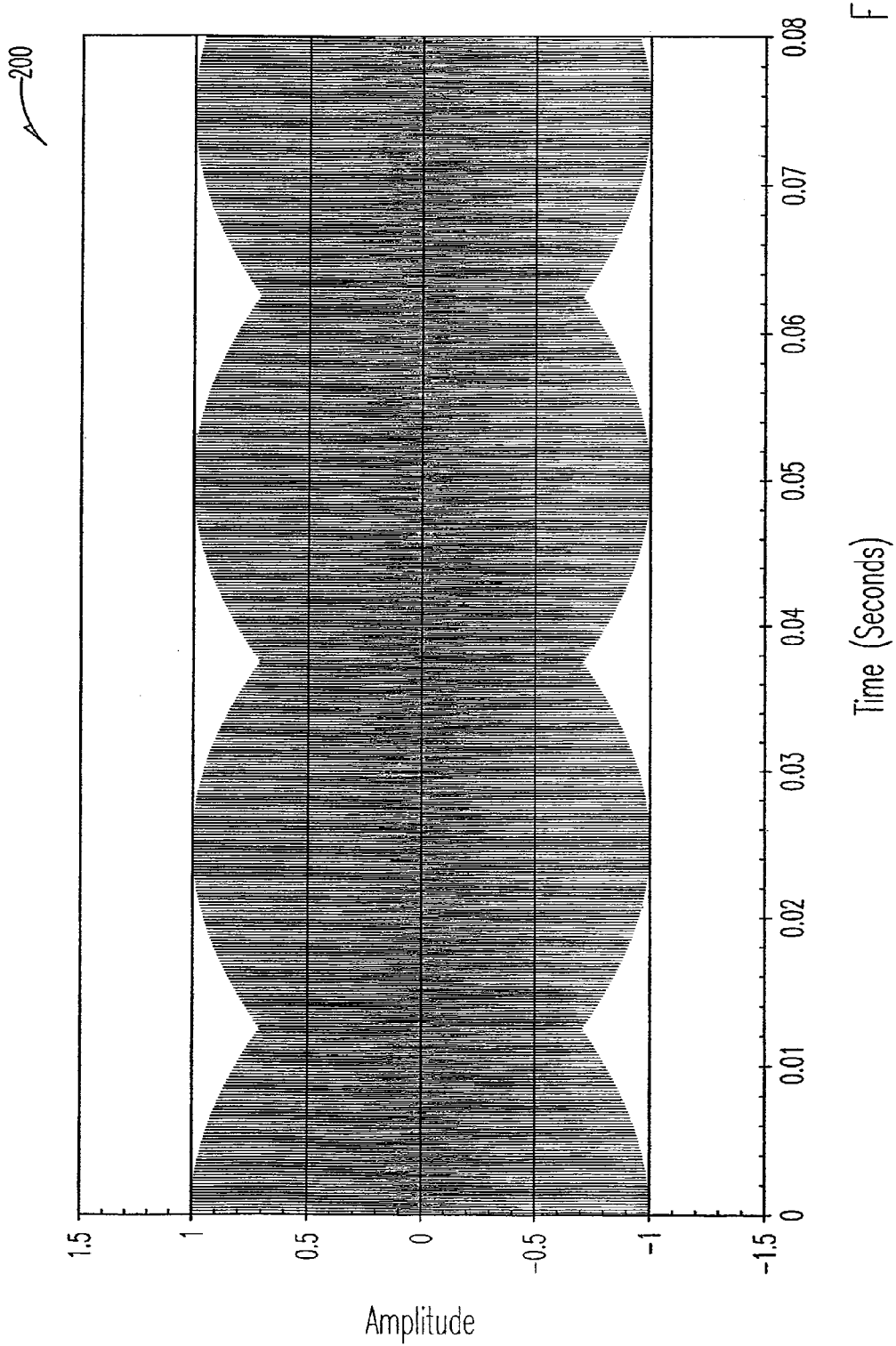
FIG. 2 is a graph of a signal according to one embodiment of the invention.

FIG. 2 is a graph of an input signal according to one embodiment of the invention. The following discussion of FIG. 2 is for the purpose of illustration only. The graph 200 graphs a signal that is present in a digital automatic gain control loop. This signal exists after the act of detecting the envelope but before the act of adjusting the gain. The abscissa of the graph 200 represents time in seconds. The ordinate of the graph 200 represents amplitude of the signal.

The signal is a 5.01 kHz sine wave that has been sampled at 20 kHz. 5.01 kHz does not divide 20 kHz by exactly an integer fraction. Thus, according to the discussion hereinbefore, the signal appears as if it includes an apparent modulation. The graph 200 confirms that the amplitude of the signal appears modulated. The apparent modulation occurs as if the waveform of the electrical signal is modulated with another signal. Mathematically, this other signal appears to be a rectified sine wave with a frequency value of $n[F_s m/n - F_{input}]$. n includes a set of whole numbers that is greater than 1. $F_s$ is the sampling frequency. m includes a set of whole numbers excluding 0. $F_{input}$ is the frequency of the electrical signal being input into the automatic gain control.

This apparent modulation is the genesis that causes distortions when the apparent modulation is transferred to the gain during the act of adjusting the gain and eventually to the signal during the act of amplifying the signal by the preamplifier. It is this apparent modulation that is inhibited by the embodiments of the invention.

The graph 200 shows that the apparent modulation includes a depth of modulation. This depth of modulation can be used in this circumstance to understand how much distortion is present in the signal: the deeper the depth of modulation, the greater the distortion. The depth of the modulation depends on whether the frequency of the signal is evenly divisible by the sampling frequency. If it is evenly divisible, or a rational factor, the depth of modulation depends on the difference of the frequency of the signal and the nearest rational factor of the sampling frequency, the actual frequency of the signal, and the bandwidth of the control loop. The smaller the difference and the higher the signal frequency, the greater the depth of modulation, for signals within the control bandwidth.

What is shown in the graph 200 is the apparent modulation that may give rise to the amplitude modulation and hence the distortions when the signal is amplified by the preamplifier. The amplitude modulation will also include a depth of modulation. This depth of modulation tends to be greater as the level of the signal rises above the threshold of the adjuster of the digital automatic gain control.

Figure 3:
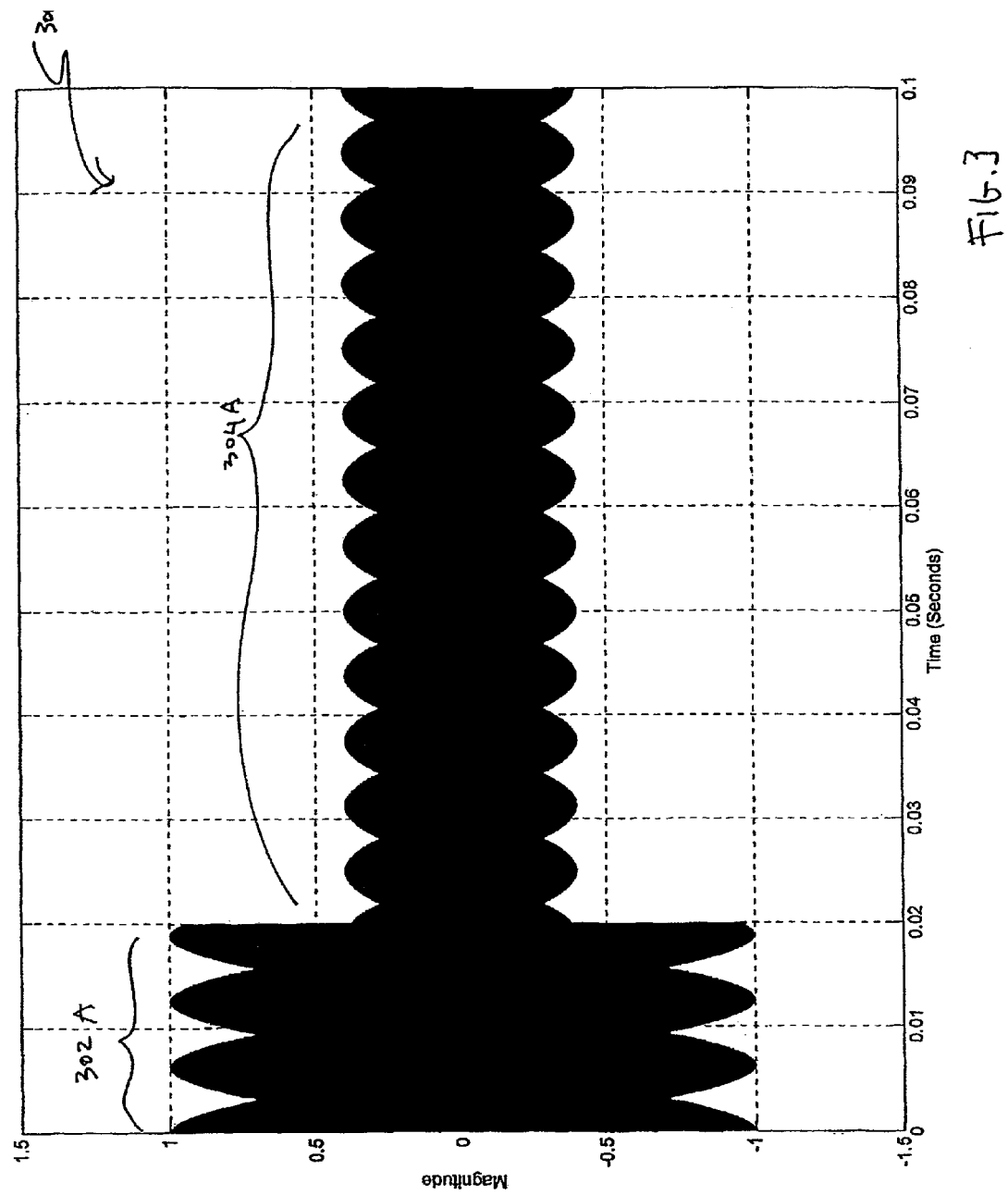
FIG. 3 is a graph of a signal according to one embodiment of the invention.
Figure 4:
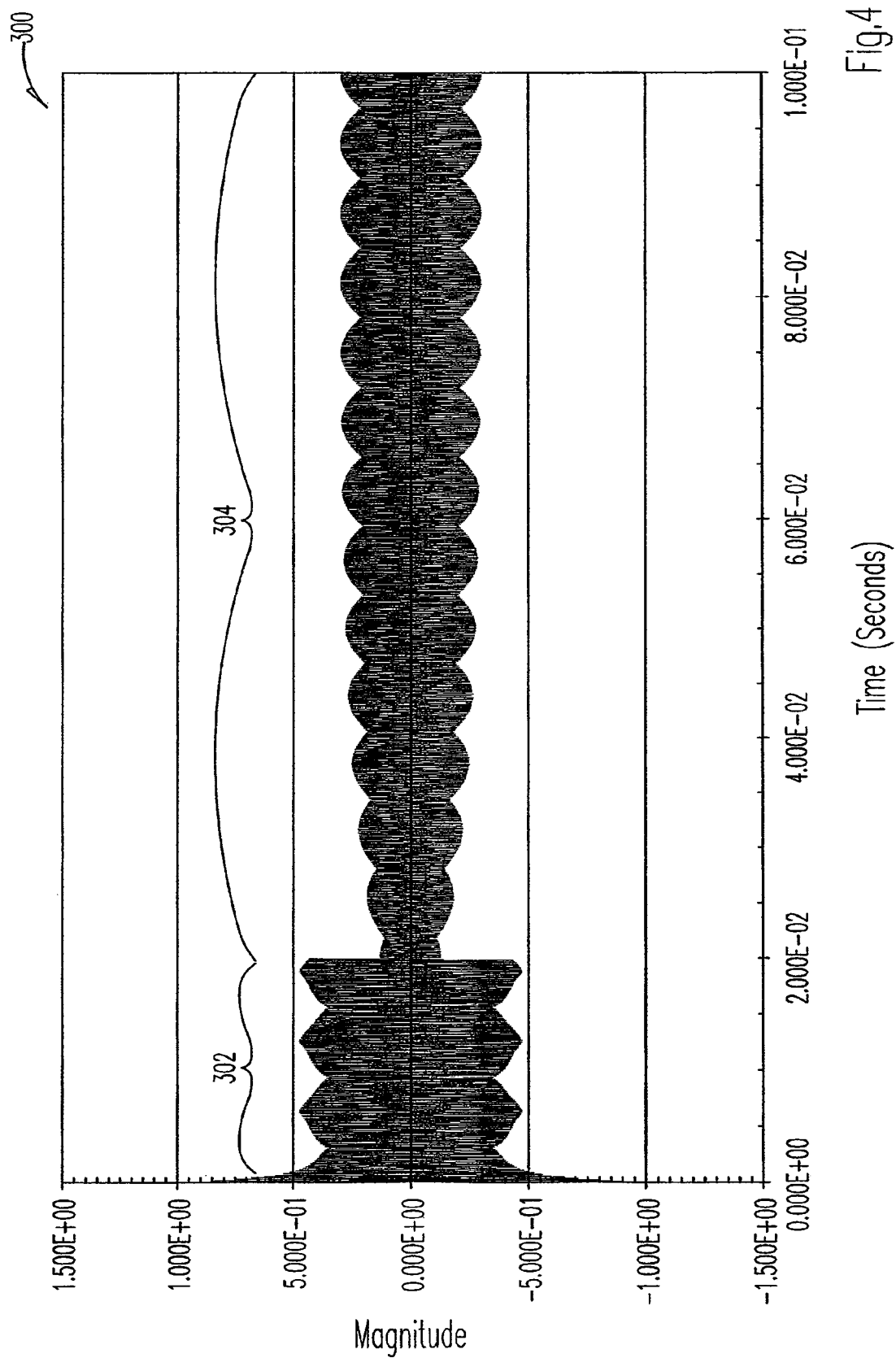
FIG. 4 is a graph of a signal according to one embodiment of the invention.

FIGS. 3-4 are graphs of a signal according to one embodiment of the invention. These graphs are for the purpose of illustration only. FIG. 3 shows a graph 300A of an input signal into a sound system having a digital automatic gain control. The graph 300A graphs an input signal that is presented to a digital automatic gain control. The abscissa of the graph 300A represents time in seconds. The ordinate of the graph 300A represents amplitude of the signal.

The graph 300A graphs a portion 302A of the signal that has an amplitude above the threshold of the digital automatic gain control. As discussed hereinbefore, the digital automatic gain control will reduce the amplitude of the input signal in the portion 302A by adjusting the gain of the preamplifier. A portion 304A of the graph 300A has an amplitude below the threshold of the digital automatic gain control. As discussed hereinbefore, the digital automatic gain control will increase the amplitude of the input signal in the portion 304A by adjusting the gain of the preamplifier.

FIG. 4 shows a graph 300B of an output signal in a sound system having a digital automatic gain control. The graph 300B graphs an output signal that is produced by a digital automatic gain control. This output signal is processed from the input signal as shown in the graph 300A of FIG. 3. The abscissa of the graph 300B represents time in seconds. The ordinate of the graph 300B represents amplitude of the signal.

A portion 302B of the graph 300B reflects the effort of the digital automatic gain control to reduce the amplitude of the input signal. The peaks of the signal in portion 302B tend to be discontinuous. These discontinuous peaks of the portion 302B are indicative of distortion in the signal. This distortion arises from the amplitude modulation of the signal that is inhibited by the embodiments of the invention. A portion 304B of the graph 300B reflects the effort of the digital automatic gain control to increase the amplitude of the input signal. The portion 304B shows a gradual increase in the amplitude over time.

Figure 5:
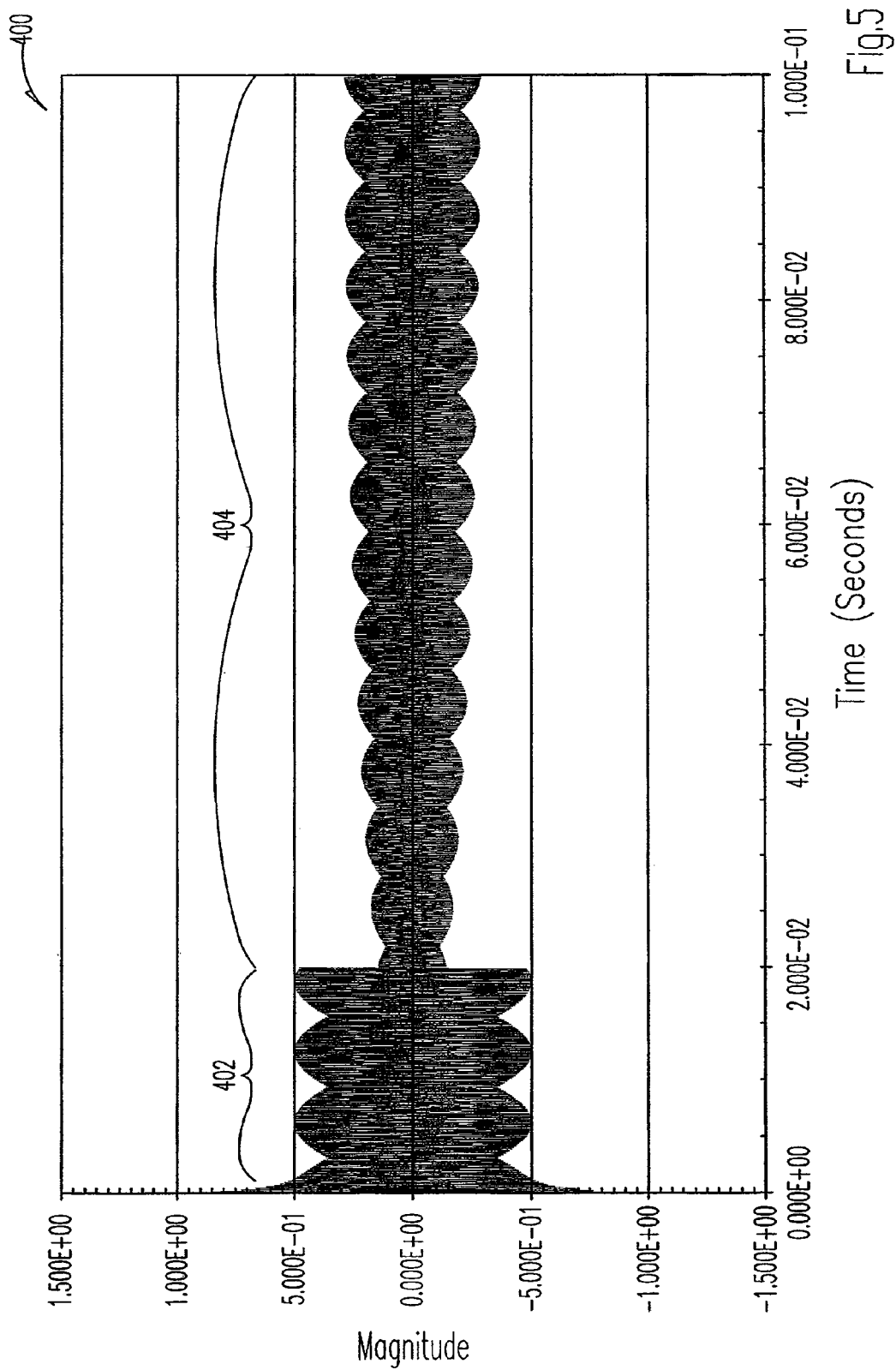
FIG. 5 is a graph of a signal according to one embodiment of the invention.

FIG. 5 shows a graph 400 of an output signal in a sound system having a digital automatic gain control. The graph 400 graphs an output signal that is produced by a digital automatic gain control. This output signal is processed from the input signal as shown in the graph 300A of FIG. 3. The abscissa of the graph 400 represents time in seconds. The ordinate of the graph 400 represents amplitude of the signal.

A portion 402 of the graph 400 indicates that the amplitude of the input signal is successfully reduced. Note that the peaks of the output signal are parabolic and not discontinuous. This indicates that the signal lacks the distortion that is caused by the amplitude modulation as discussed hereinbefore. A portion 404 of the graph 400 shows that the amplitude of the input signal is successfully increased.

Figure 6:
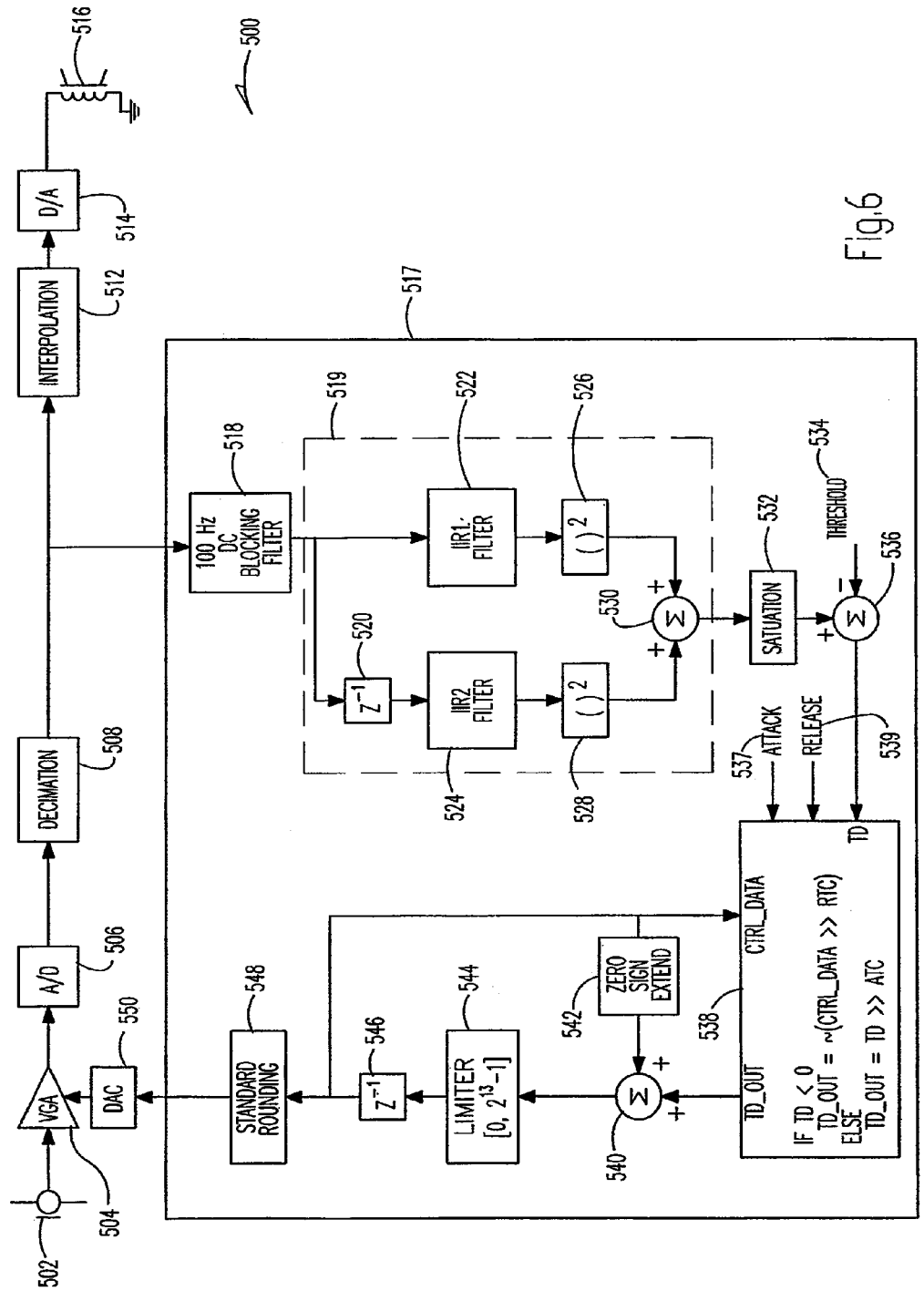
FIG. 6 is a block diagram of a system according to one embodiment of the invention.

FIG. 6 is a block diagram of a system according to one embodiment of the invention. A system 500 receives a signal, which represents sound energy, from a microphone 502. The signal enters a preamplifier 504. The preamplifier 504 amplifies the signal so that the signal has strength for subsequent processing by the system 500. The signal, which is amplified, enters an analog-to-digital converter 506. The analog-to-digital converter 506 converts the signal to a digital signal. The digital signal is in a form that can be easily processed by a digital integrated circuit. The digital signal enters a decimator 508. The decimator 508 reduces the number of samples while increasing the word length in the digital signal for subsequent processing of the digital signal. The digital signal, which has been decimated, enters an interpolator 512. After interpolation by the interpolator 512, the digital signal enters a digital-to-analog converter 514. The digital-to-analog converter 514 converts the digital signal to an analog signal. The analog signal enters a speaker 516. The speaker 516 reproduces sounds from the analog signal.

The digital signal, which has been decimated by the decimator 508, is also processed by a digital automatic gain control 517. Recall that the digital automatic gain control 517 helps to change the gain of the preamplifier 504. Specifically, the digital signal enters a filter 518. The filter 518 filters out low frequencies in the digital signal. In one embodiment, the low frequencies include frequencies below 100 Hertz.

The digital signal, which has been filtered, enters a detector 519. The detector 519 uses Hilbert filters to detect the envelope of the digital signal. Specifically, the digital signal enters a digital delay element 520. The digital delay element 520 delays the digital signal and produces a delayed signal. The delayed signal enters a first Hilbert filter 524. The first Hilbert filter comprises an infinite impulse response filter. The first Hilbert filter 524 filters the delayed signal to form a first filtered signal. Besides presenting itself to the digital delay element 520, the digital signal also enters a second Hilbert filter 522. The second Hilbert filter comprises another infinite impulse response filter. The second Hilbert filter 522 filters the digital signal to form a second filtered signal.

The first filtered signal enters a first multiplier 528. The first multiplier 528 squares the first filtered signal to form a first squared signal. The second filtered signal enters a second multiplier 526. The second multiplier 526 squares the second filtered signal to form a second squared signal. Both the first squared signal and the second squared signal enter an adder 530. The adder 530 adds the first squared signal and the second squared signal together to form a sum-of-square signal.

The sum-of-square signal enters a limiter 532. The limiter 532 limits the digital range of the sum-of-square signal to a desired operating range. The sum-of-square signal then enters an adder 536. The adder 536 determines the difference between the sum-of-square signal and a threshold 534. The sum-of-square signal is an envelope of the digital signal that is produced by the detector 519. Thus, in another view, the adder 536 determines the difference between the envelope of the digital signal and a threshold 534. As will be discussed, this difference is used to adjust the gain of the preamplifier 504.

The difference determined by the adder 536 enters an adjuster 538. The adjuster 538 also receives the previous gain, an attack time constant, and a release time constant. The previous gain is the gain previously adjusted by the adjuster 538. The attack time constant is used to decrease the gain, and the release time constant is used to increase the gain.

If the difference is negative, the adjuster 538 increases the gain of the preamplifier 504. The gain is increased by shifting the bits of the previous gain to the right by the release time constant, and taking the negative of the result of the shifting. In other words, when the envelope of the digital signal is below the threshold 534, the gain of the preamplifier 504 should be increased. Such increase depends on the previous gain. The new gain is obtained by multiplying the previous gain by the inverse of a power of two. The modifier in this instance has a direct relationship to the release time constant. The discussed implementation uses shifts, which is equivalent to multiplications by inverse powers of two, to implement the time constants, but it should be understood that these time constants can be implemented by other techniques, such as by regular multiplies.

If the difference is positive, the adjuster 538 decreases the gain of the preamplifier 504. The gain is decreased by shifting the bits of the difference to the right by the attack time constant. In other words, when the envelope of the digital signal is above the threshold 534, the gain of the preamplifier 504 should be decreased. Such decrease depends on the difference between the envelope of the digital signal and the threshold. The new gain is obtained by multiplying the difference by the inverse of a power of two. The modifier in this instance has a direct relationship to the attack time constant.

The new gain enters an adder 540. The adder 540 adds the new gain to an adjusted previous gain to form the gain. The adjusted previous gain is formed from a width adjuster 542 that adjusts the width of the word of the previous gain. The gain enters a limiter 544. The limiter 544 limits the range of the gain. The gain then enters a buffer 546. The buffer 546 stores the gain and presents the gain to a rounding circuit 548. The buffer 546 also feeds back the gain to the width adjuster 542 and the adjuster 538. The rounding circuit 548 rounds the gain to a smaller precision value so as to be compatible with the input width of subsequent circuitry.

The gain, which is rounded, enters a digital-to-analog converter 550. The digital-to-analog converter 550 converts the gain from digital to analog and presents the gain, which is now analog, to the preamplifier 504. The preamplifier 504 uses the gain to amplify the signal, which represents sound energy, from the microphone 502.

Figure 7:
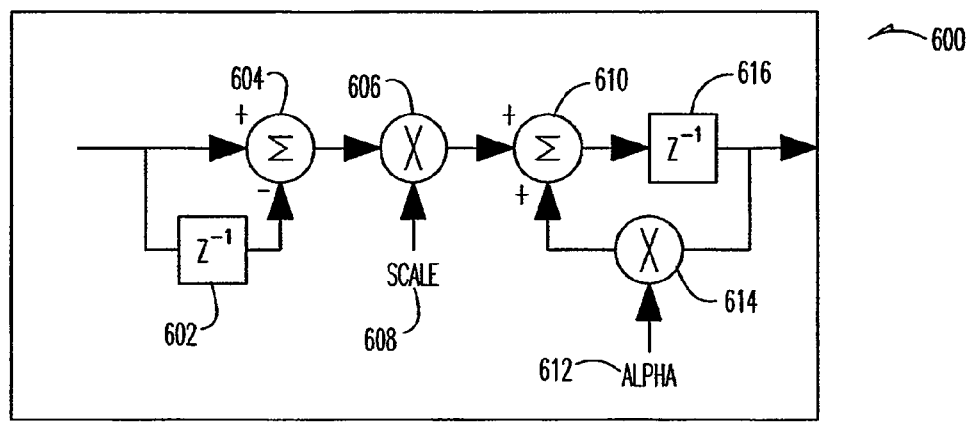
FIG. 7 is a block diagram of a filter according to one embodiment of the invention.

FIG. 7 is a block diagram of a filter according to one embodiment of the invention. The filter 600 acts to filter out low frequencies from a digital signal. The digital signal enters both a first adder 604 and a first digital delay element 602. The first digital delay element 602 delays the digital signal to produce a delayed digital signal. The adder 604 determines the difference between the digital signal and the delayed digital signal. This difference enters a multiplier 606. The multiplier 606 multiplies the difference by a scale 608 to produce a scaled signal. The scale 608 is used to inhibit the filter 600 from overflow. The scaled signal enters a second adder 610. The second adder 610 adds the scaled signal with a block signal to produce a filtered signal. The block signal will be discussed hereinafter. The filtered signal enters a second digital delay element 616. The second digital delay element 616 delays the filtered signal. The filtered signal then exits the filter 600. A portion of the filtered signal feeds back into a second multiplier 614. The second multiplier 614 multiplies the filtered signal, which is delayed, by an alpha signal to form the blocked signal. The alpha signal determines a range of frequencies that will be blocked by the filter 600.

Figure 8:
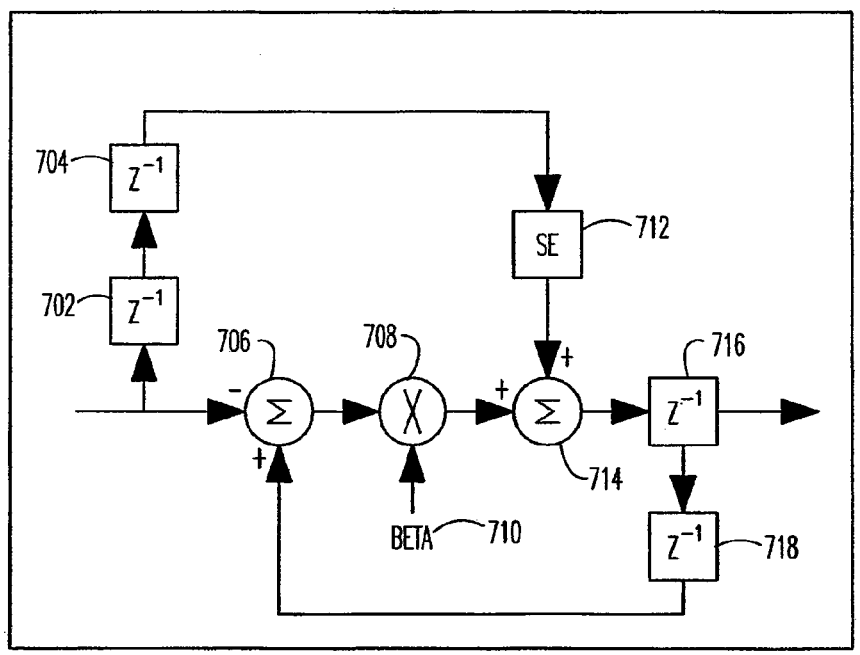
FIG. 8 is a block diagram of a filter according to one embodiment of the invention.

FIG. 8 is a block diagram of a filter according to one embodiment of the invention. A filter 700 is an infinite-impulse response filter. The filter 700 is configured as a two-zeros two-poles filter. The filter 700 can be used as a Hilbert filter in a detector as part of a digital automatic gain control circuit. The digital signal enters a first digital delay element 702, a second digital delay element 704, and a scale element 712. Thus, the digital signal is delayed by the first digital delay element 702, delayed by the second digital delay element 704, and scaled by the scale element 712 to produce a scaled signal.

The digital signal also enters a first adder 706. The first adder 706 determines the difference between the digital signal and the feedback signal. The difference enters a multiplier 708. The multiplier 708 multiplies the difference and a beta signal 710 to form a modified signal. The beta signal 710 acts to control the phase of the difference. The beta signal contains a number of bits that is used to represent a desired number to be input into the multiplier 708.

The modified signal enters a third digital delay element 716. The third digital delay element 716 delays the modified signal to form a filtered signal. The filtered signal exits the filter 700 to be used by other circuitry. A portion of the filtered signal enters a fourth digital delay element 718. The fourth digital delay element 718 delays the filtered signal to form the feedback signal.

Figure 9:
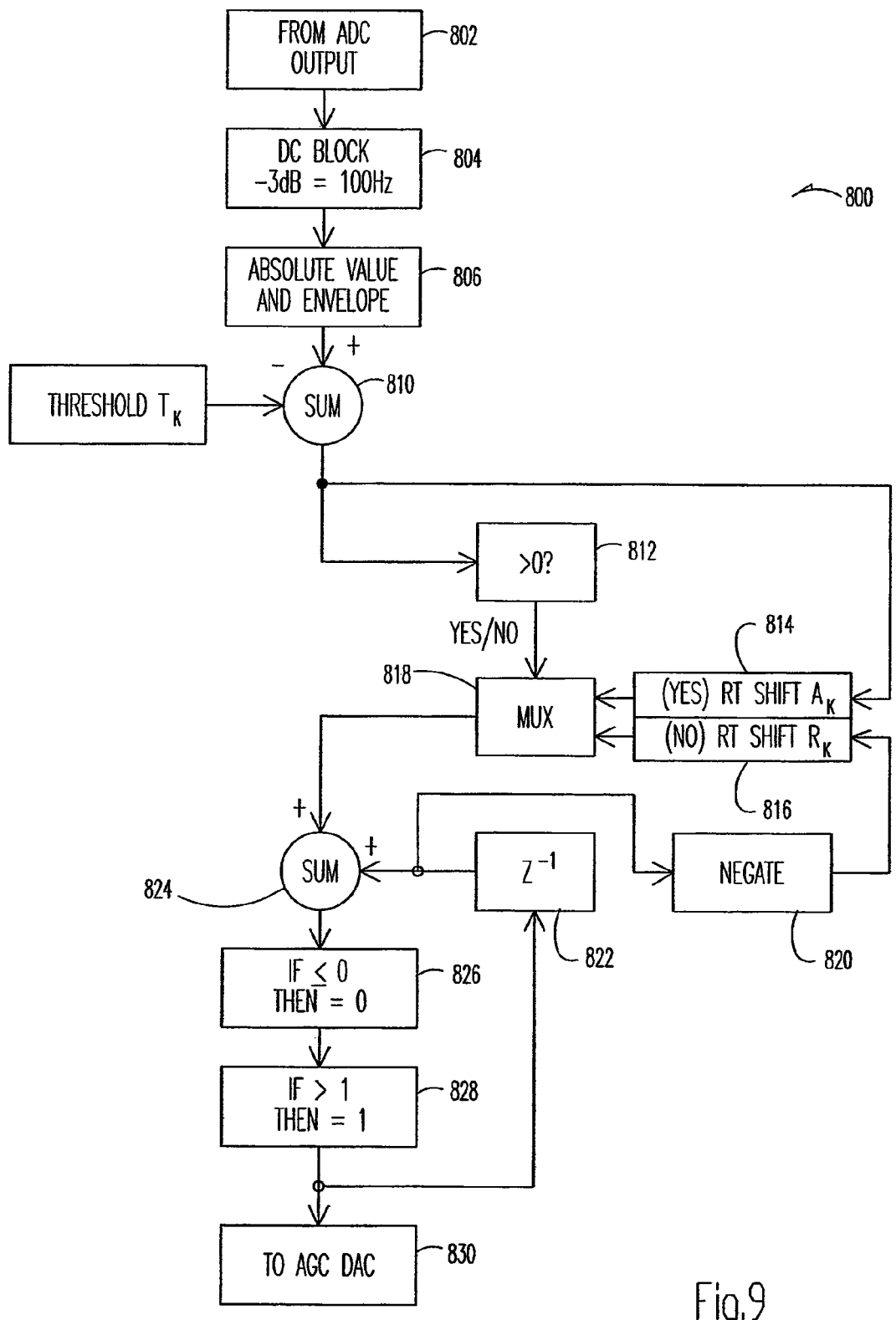
FIG. 9 is a process diagram of a method according to one embodiment of the invention.

FIG. 9 is a process diagram of a method according to one embodiment of the invention. The process 800 discusses the feedback loop that analyzes the digital signal and determines whether the level of the digital should be adjusted. The process 800 begins at an act 802. The act 802 converts an analog signal to a digital signal. The digital signal is presented to an act 804. The act 804 blocks low frequencies from the digital signal to produce a filtered signal. In one embodiment, the low frequencies, which are blocked, are less than about 100 Hertz.

The filtered signal is presented to an act 806. The act 806 forms an envelope that lacks the apparent modulation. One suitable technique of forming an envelope that lacks the apparent modulation includes using Hilbert filters. The envelope is presented to an act 810. The act 810 subtracts the envelope from a threshold to form a difference. The difference is presented to acts 812 and 814.

The act 812 determines if the difference is greater than zero. If the difference is greater than zero, the gain should be decreased. In other words, the envelope of the digital signal is greater than the threshold. The digital signal is at a level beyond the operating range of a processing system and such level should be decreased. If the difference is less than zero, than the gain should be increased. When the envelope of the digital signal is less than the threshold, the digital signal should be strengthened by increasing the gain for subsequent processing.

The result of the act 812 is presented to an act 818. The act 818 uses the result of the act 812 to select the result of either act 814 or act 816 to form a gain. Thus, the act 818 switches between the result of the act 814 or the act 816 depending on the result of the act 812. If the gain needs to be decreased, the act 818 selects the result of the act 814. The act 814 decreases the gain by shifting the bits of the difference to the right by an attack constant. If the gain needs to be increased, the act 818 selects the result of the act 816. The act 816 increases the gain by shifting the bits of the feedback signal, which is delayed and negated, to the right by a release constant.

The gain, which is formed by the act 818, is presented to an act 824. The act 824 sums the gain and the feedback signal, which is delayed. The feedback signal, which is delayed, is formed by an act 822. The act 820 negates the feedback signal, which is delayed, and presents the result to the act 816 as discussed hereinbefore.

The act 826 equates the gain to 0 if the gain is less than or equal to zero. Otherwise, the act 828 equates the gain to 1 if the gain is greater than 1. The result of the act 826 and the act 828 is presented to an act 830. The act 830 converts the digital form of the gain to an analog form, which is suitable for an analog preamplifier.

CONCLUSION

Thus, systems, devices, and methods have been discussed for inhibiting undesired amplitude modulation which causes distortions in the amplified signal in a sound system. The embodiments of the invention inhibit such undesired amplitude modulation by reducing apparent sampling rate distortion.

The digital system as described has a number of benefits not seen before. One benefit is an enhanced manufacturing process that reduces a need for external components, such as capacitors, and the need to couple the external components to a circuit through I/O pins. Another benefit includes a reduction in the die area required to implement the digital automatic gain control loop. Other benefits include an enhanced control of the tolerance of the bandwidth of the automatic gain control, and the tolerance of the loop time constants of the automatic gain control. The system also benefits from an enhanced power efficiency and low operating voltage performance. Additionally, the system allows a non-linear signal processing by selectively controlling the gain of the preamplifier or providing information to a Nyquist-rate digital signal processor to compensate for adaptive gain changes in the preamplifier.

Although the specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. It is to be understood that the above description is intended to be illustrative and not restrictive. Combinations of the above embodiments and other embodiments will be apparent to those of skill in the art upon reviewing the above description. The scope of the invention includes any other applications in which the above structures and fabrication methods are used. Accordingly, the scope of the invention should only be determined with reference to the appended claims, along with the full scope of equivalents to which such claims are entitled.

What is claimed is:

1. A system, comprising:
    a delay element configured to delay an input signal to produce a delayed signal;
    a first filter configured to filter the delayed signal to produce a first filtered signal;
    a second filter configured to filter the input signal to produce a second filtered signal;
    an adder configured to combine the first and second filtered signals to produce a smooth envelope;
    a comparator configured to calculate a difference between the smooth envelope and a threshold: and
    an adjuster configured to adjust a gain based on whether the difference is greater than or less than zero.

2. The system of claim 1, further comprising a third filter configured to filter out frequencies from the input signal, wherein the frequencies are less than about 100 Hertz.

3. The system of claim 2, further comprising:
    a first multiplier configured to:
        receive the first filtered signal; and
        square the first filtered signal to form a first squared signal;
    a second multiplier configured to:
        receive the second filtered signal; and
        square the second filtered signal to form a second squared signal;
    the adder further configured to combine the first and second filtered signals to form the smooth envelope by adding the first squared signal and the second squared signal; and
    a limiter configured to:
        receive the smooth envelope; and
        limit the smooth envelope to a desired operating range.

4. The system of claim 1, wherein the adjuster is further configured to:
    receive the difference, a release time constant, and an attack time constant.

5. The system claim 4, wherein:
    the adjuster is further configured to receive a previous gain;
    if the difference is negative, the adjuster increases the gain by right shifting bits of the previous gain by the release time constant to form a new gain and performs an additive inverse of the new gain; and
    if the difference is positive, the adjuster decreases the gain by right shifting bits of the difference by the attack time constant to form the new gain.

6. The system of claim 5, further comprising:
    a width adjuster configured to adjust a word width of the previous gain and produce an adjusted previous gain;
    a second adder configured to add the new gain and the adjusted previous gain to produce the gain;
    a limiter configured to limit the range of the gain so that the gain is positive;

a buffer configured to store the gain as a stored gain, wherein the stored gain is defined as the previous gain, which is presented to the adjuster and the width adjuster; and a rounding circuit configured to round the stored gain to a smaller precision value to be compatible with an input width of subsequent circuitry that includes a digital-to-analog converter.

7. The system of claim 1, wherein the adjuster is further configured to:
receive the difference, a release time constant, and an attack time constant;
increase the gain if the difference is negative; and
decrease the gain if the difference is positive.

8. The system of claim 7, wherein:
the first filter includes a first digital delay that receives the input signal and produces a delayed digital signal;
the first filter includes a second comparator that determines a second difference between the input signal and the delayed digital signal;
the first filter includes a first multiplier that multiplies the second difference and a scale to form a scaled signal, wherein the scaled signal inhibits the first filter from overflow.

9. The system of claim 8, wherein:
the first filter includes a second adder that adds the scaled signal and a blocked signal to form a filtered signal;
the first filter includes a second digital delay that receives the filtered signal and presents a filtered signal that is delayed; and
the first filter includes a second multiplier that multiplies the filtered signal that is delayed and an alpha signal to form the blocked signal, wherein the alpha signal determines a range of frequencies that will be blocked by the first filter.

10. A digital analog gain control, comprising:
a delay element configured to delay an input signal to produce a delayed signal;
a first infinite-impulse-response (IIR) filter configured to produce a first filtered signal from the delayed signal;
a second IIR filter configured to produce a second filtered signal from the input signal;
an adder configured to combine the first and second filtered signals to produce a smooth envelope;
a comparator configured to calculate a difference between the smooth envelope and a threshold: and
an adjuster configured to:
receive the difference, a release time constant, and an attack time constant;
adjust a gain based at least in part on the difference being one of two conditions, wherein the two conditions include being a negative number and being a positive number,
increase the gain if the difference is negative; and
decrease the gain if the difference is positive.

11. The digital analog gain control of claim 10, wherein the first IIR filter includes a first delay, a second delay, and a scale element, wherein the input signal is delayed by the first delay, the is delayed by the second delay, and the input signal is scaled by the scale element to form a scaled signal.

12. The digital analog gain control of claim 11, wherein:
the first infinite-impulse response filter includes a second comparator that determines a second difference between the input signal and a feedback signal;
the first infinite-impulse-response filter includes a multiplier that multiplies the second difference and a beta signal to form a modified signal, wherein the beta signal modifies a phase of the difference;
the first infinite-impulse-response filter includes a third delay that delays modified signal to form a filtered signal; and
the first infinite-impulse-response filter includes a fourth delay that delays the filtered signal to form the feedback signal.

13. A method for controlling a gain of an amplifier, comprising:
delaying an input signal to produce a delayed signal,
filtering the delayed signal to produce a first filtered signal;
filtering the input signal to produce a second filtered signal;
combining the first and second filtered signals to produce a smooth envelope; and
subtracting the smooth envelope from a threshold to form a difference, wherein the difference is used to control the gain.

14. The method of claim 13, further comprising:
determining if the difference is greater than zero;
right shifting the bits of the difference by an attack constant to form a decreased gain; and
right shifting bits of a negated signal by a release constant to form an increased gain.

15. The method of claim 14, further comprising:
presenting the decreased gain as the gain if the difference is greater than zero; and
presenting the increased gain as the gain if the difference is less than zero.

16. The method of claim 15, further comprising:
summing the gain and a feedback signal that is delayed to form a modified gain signal;
presenting a final gain to an analog-to-digital converter, wherein the final gain is zero if the modified gain signal is less than or equal to zero, and the final gain is one if the modified gain signal is greater than one;
delaying the final gain to produce the feedback signal that is delayed; and
negating the feedback signal that is delayed to form the negated signal.

17. The method of claim 13, further comprising blocking low frequencies from the input signal.

18. The method of claim 17, where-in blocking includes blocking low frequencies that are less than about 100 Hertz.

* * * * *